(12) United States Patent
Taniguchi et al.

(10) Patent No.: US 6,215,426 B1
(45) Date of Patent: Apr. 10, 2001

(54) OFFSET CORRECTING CIRCUIT FOR ENCODER

(75) Inventors: Mitsuyuki Taniguchi, Gotenba; Tadashi Inoue, Oshino-mura, both of (JP)

(73) Assignee: Fanuc Ltd., Yamanashi (JP)

( * ) Notice: Subject to any disclaimer, the term of this patent is extended or adjusted under 35 U.S.C. 154(b) by 0 days.

(21) Appl. No.: 09/214,760

(22) PCT Filed: May 12, 1998

(86) PCT No.: PCT/JP98/02099

§ 371 Date: Jan. 12, 1999

§ 102(e) Date: Jan. 12, 1999

(87) PCT Pub. No.: WO98/51997

PCT Pub. Date: Nov. 19, 1998

(30) Foreign Application Priority Data

May 12, 1997 (JP) .................................................... 9-135770

(51) Int. Cl.$^7$ .................................................... H03M 1/48
(52) U.S. Cl. .............................................. 341/115; 341/111
(58) Field of Search .................................. 341/111, 116, 341/115, 94, 101, 112; 702/163; 364/571

(56) References Cited

U.S. PATENT DOCUMENTS

| 4,318,617 | 3/1982 | Orsen . | |
|---|---|---|---|
| 4,458,322 | * 7/1984 | Veale | 364/571 |
| 5,786,781 | * 7/1998 | Taniguchi et al. | 341/111 |
| 5,943,639 | * 8/1999 | Tanaka et al. | 702/163 |

FOREIGN PATENT DOCUMENTS

| 0 473 373 | 3/1992 | (EP) . |
|---|---|---|
| 0 599 175 | 6/1994 | (EP) . |
| 80 26423 | 7/1981 | (FR) . |
| 4-365542 | 12/1992 | (JP) . |
| 6-58769 | 3/1994 | (JP) . |
| 6-201403 | 7/1994 | (JP) . |
| 7-209020 | 8/1995 | (JP) . |
| 7-218288 | 8/1995 | (JP) . |

OTHER PUBLICATIONS

Supplemental European Search Report for PCT/JP98/02099 issued Jun. 28, 2000.

* cited by examiner

Primary Examiner—Brian Young
Assistant Examiner—John Nguyen
(74) Attorney, Agent, or Firm—Staas & Halsey LLP

(57) ABSTRACT

An offset correcting circuit for an encoder capable of detecting a correct offset value even when a sampling period is long as in the case of a low-speed A/D converter and restraining the influence of noise. The offset correcting circuit for an encoder adapted to output an angle signal based on digital signals obtained by performing A/D conversions of two signals having phases different by about 90 degrees in accordance with the same timing includes an offset detecting circuit for obtaining an offset value of one of the two signals, using an A/D converted value of that one signal which is obtained when an A/D converted value of the other of the two signals is zero or close to zero, and a compensating circuit for compensating an offset of that one signal using the offset value detected by the offset detecting circuit.

8 Claims, 11 Drawing Sheets

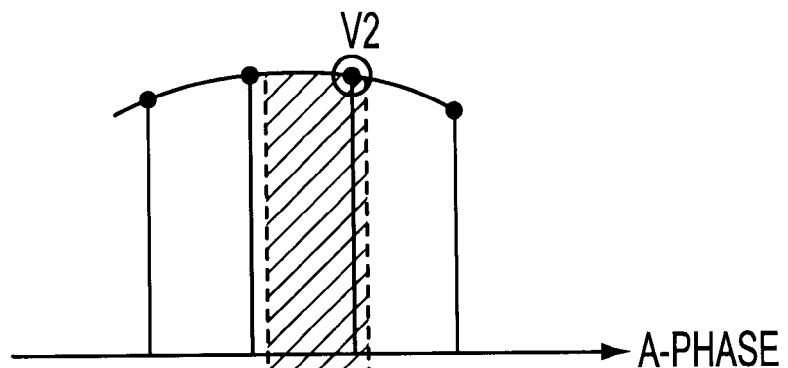
FIG. 4A
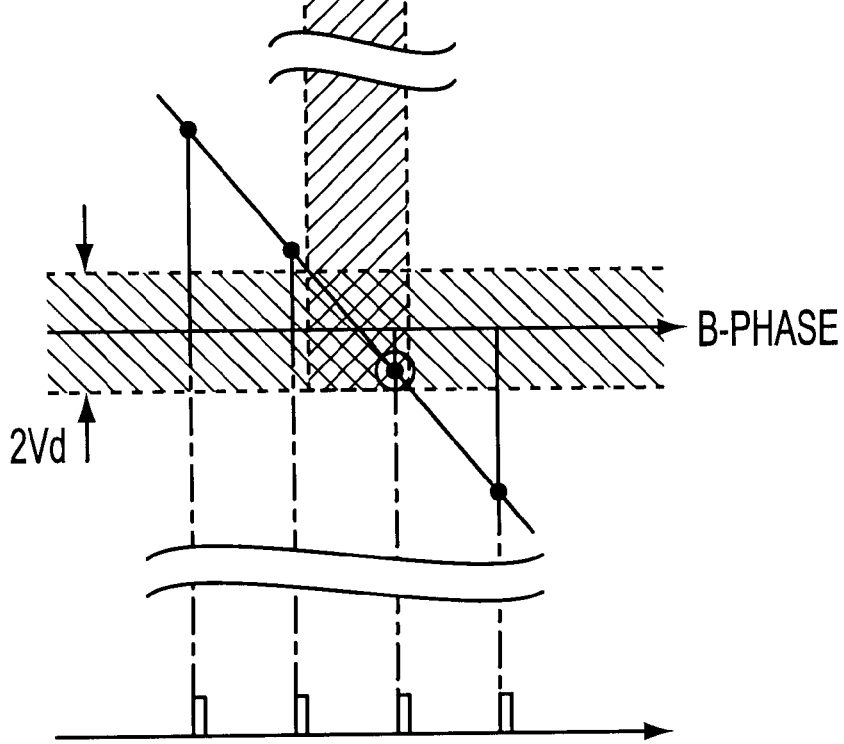
FIG. 4B
FIG. 4C (A-PHASE SIGNAL)

(B-PHASE SIGNAL)

(V2)

(V4)

(OFFSET SIGNAL)

(V1)

(V3)

(OFFSET SIGNAL)

FIG. 7B (A-PHASE) 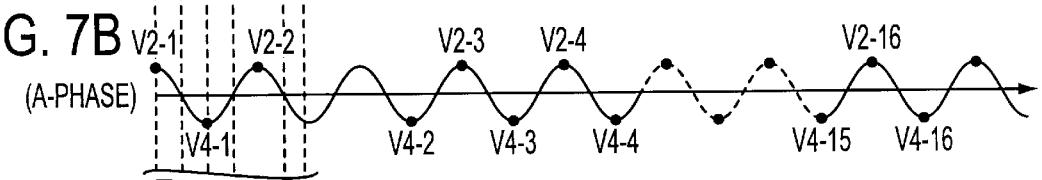
FIG. 7C (B-PHASE) 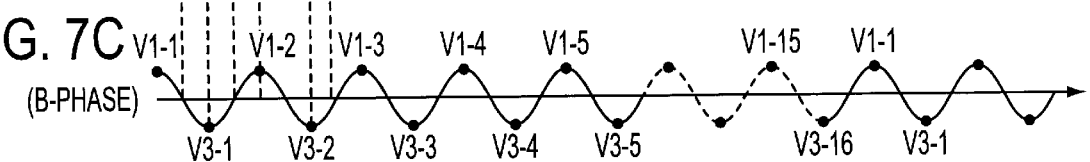
FIG. 7D (A-PHASE V2EN) 
FIG. 7E (A-PHASE V4EN) 
FIG. 7F (A-PHASE OFFSET DATA) 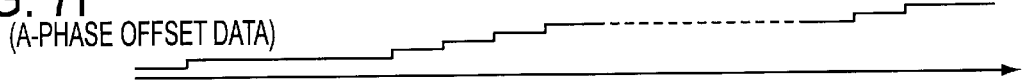
FIG. 7G (B-PHASE V1EN) 
FIG. 7H (B-PHASE V3EN) 
FIG. 7I (B-PHASE OFFSET DATA) 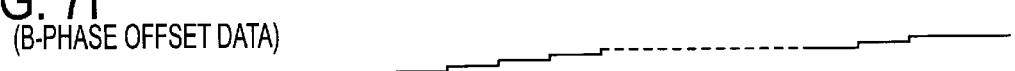

FIG. 8A
(A-PHASE)
ZA
FIG. 8B
(B-PHASE)
ZB
FIG. 8C
(PA)
FIG. 8D
(PB)
FIG. 8E      
FIG. 8F
(A-PHASE)
FIG. 8G
(B-PHASE)
FIG. 8H
(PA)
FIG. 8I
(PB)
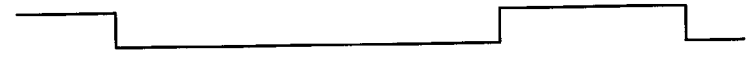
FIG. 8J     

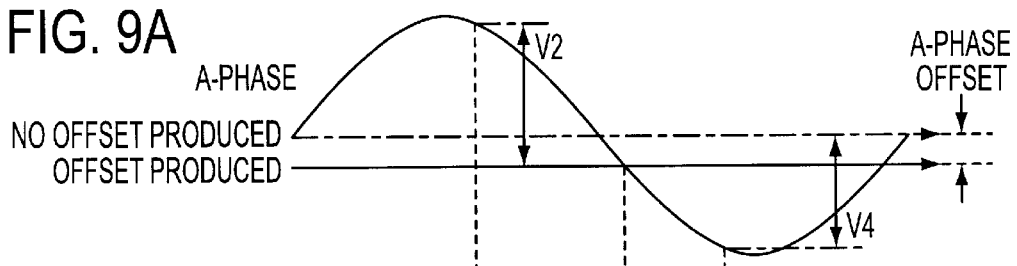
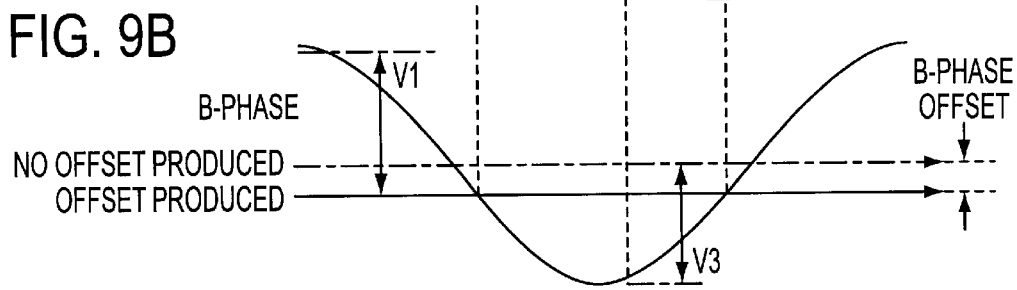
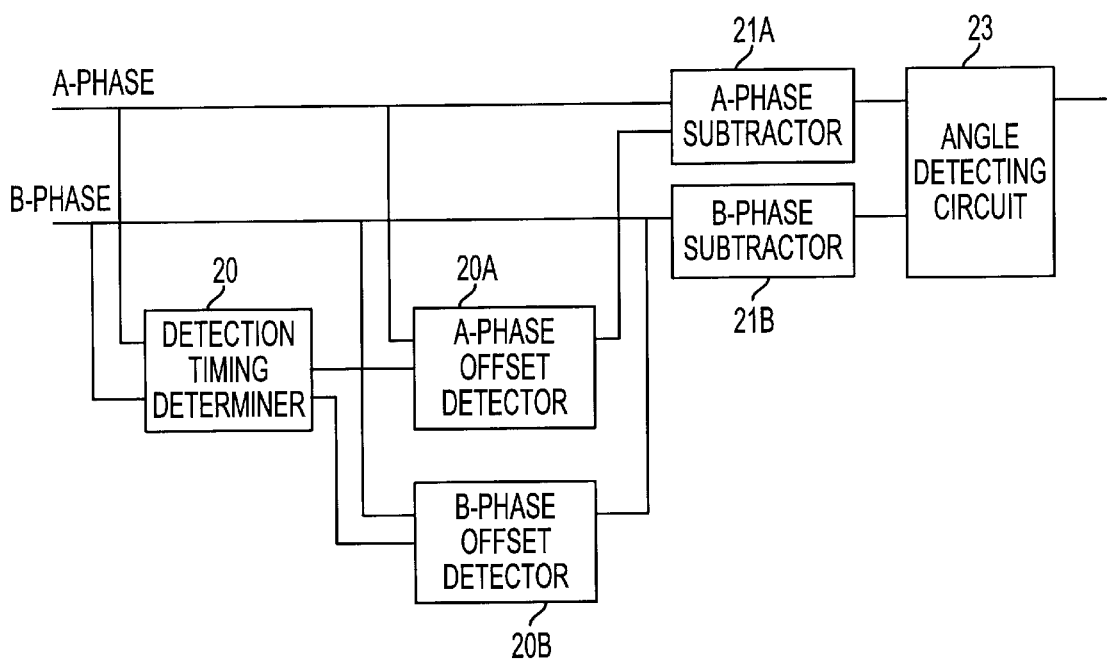
FIG. 10

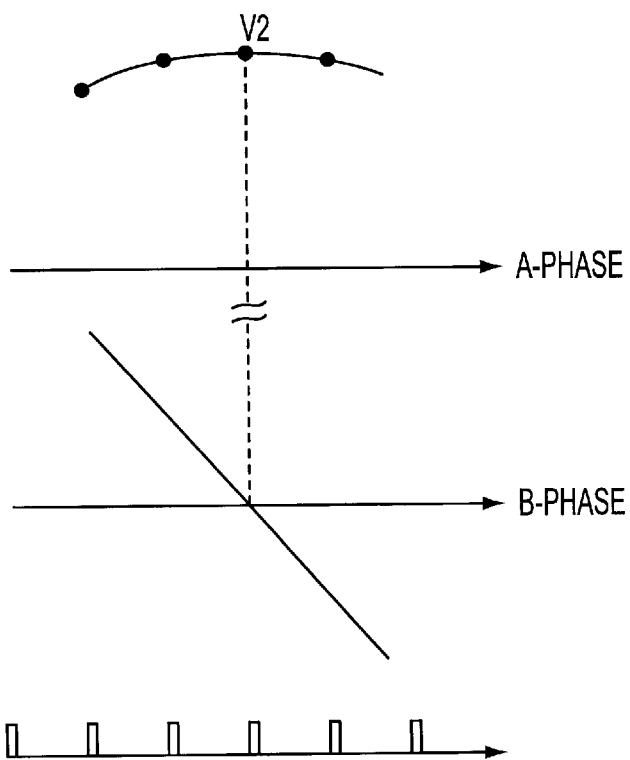
FIG. 11A
FIG. 11B
FIG. 11C
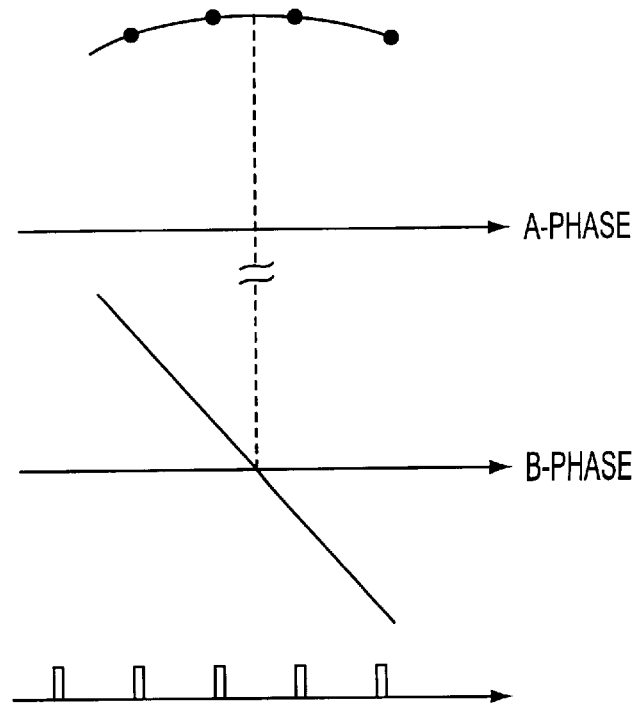
FIG. 12A
FIG. 12B
FIG. 12C (A-PHASE SIGNAL)

(B-PHASE SIGNAL)

(V2)

(V4)

(OFFSET SIGNAL)

OFFSET CORRECTING CIRCUIT FOR ENCODER

FIELD OF THE INVENTION

The present invention relates to an encoder for use in position detection of a motor or a linear encoder used in an NC machine tool or an industrial robot, and specifically to an offset correcting circuit for compensating an offset in an encoder.

DESCRIPTION OF THE RELATED ART

As a method of obtaining a moving amount of a movable body as an angular amount, there is known a method in which a moving amount of the movable body is first detected by a position detector as an analog value in the form of a sine wave, a cosine wave or the like, then the detected analog value is converted to a digital value, and then the digital value is converted to an angular amount by an encoder.

The position detector detects A-phase and B-phase signals which are two signals of different phases in order to improve resolution. The two signals of different phases are converted by analog-digital converters to digital signals, respectively, and an angle is computed based on the digital signals. If the zero level of a sine or cosine wave detected by the position detector shifts and an offset is produced, the detected angular amount involves an error.

FIGS. 8a to 8j are diagrams for explaining an offset produced at an encoder. FIGS. 8a to 8e relate to the case where an offset is not produced, and FIGS. 8f to 8j relate to the case where an offset is produced. In FIGS. 8a and 8b, when the zero level is taken as a threshold, a rectangular pulse PA is formed from the A-phase signal (FIG. 8c), and a rectangular pulse PB is formed from the B-phase signal (FIG. 8d). Each time the rectangular pulse rises or falls, increment or decrement is effected at a position counter (FIG. 8e). If the zero level does not shift and an offset is not produced and if a movable body is doing a uniform motion, duty factors of the rectangular pulses PA, PB are both 50%.

In contrast thereto, as shown in FIGS. 8f and 8g, if the zero level shifts and an offset is produced (as indicated by a broken line), duty factors of the rectangular pulse PA (FIG. 8h) and the rectangular pulse PB (FIG. 8i) deviate from 50% to a large extent, and timing of increment or decrement at the position counter shifts in the forward or backward direction even if a movable body is doing a uniform motion. An error in position detection caused by such an offset has a large influence through an interpolation performed for improving the resolution.

As a conventional method for correcting the offsets of the A-phase and B-phase signals, there is known a method in which a difference between each of the A-phase and B-phase signals and a signal having a phase by 180° different from the phase of each signal is regulated by an adjustable resistor to thereby correct the offset.

This method of correcting the offset has problems in that it requires a process of adjusting the adjustable resistor, and in that handling thereof is troublesome. Further, even after such regulation, an offset may be again produced due to a difference in age deterioration between elements. It is possible, but actually difficult, to regulate the offset again by the adjustable resistor.

As another method of correcting the offset, it is conceivable to remove a direct-current component by AC coupling. This method has, however, a problem that the offset correction cannot be performed when a movable body stops and frequencies of the A-phase and B-phase signals are both "0".

In order to solve the above problems, there has been proposed a method in which an average of positive and negative values which one of the A-phase and B-phase signals takes when the other crosses zero is obtained to thereby correct the offset (for example, Japanese Patent Preliminary Publication No. Hei 1-92612). According to this method of correcting the offset, in the case shown in FIGS. 9a and 9b, the offset correction value for the A-phase signal is an average (V2+V4)/2 of a positive value V2 and a negative value V4 which the A-phase signal takes when the B-phase signal crosses zero, and the offset correction value for the B-phase signal is an average (V1+V3)/2 of a positive value V1 and a negative value V3 which the B-phase signal takes when the A-phase signal crosses zero. The offset correction can be performed by an offset correcting circuit having structure as shown in FIG. 10.

The conventional offset correcting circuit shown in FIG. 10 has a detection timing computing element 20 for detecting the time when one of the A-phase and B-phase signals crosses zero and determining the time when a value of the other of the signals is to be detected, an A-phase offset detector 20A and a B-phase offset detector 20B for executing the above computation using positive and negative digital values sampled in accordance with detection timing determined by the detection timing computing element 20 to thereby detect an offset correction value, an A-phase subtracter 21A for subtracting an A-phase offset correction value from an A-phase digital signal to thereby obtain an offset-corrected value, a B-phase subtracter 21B for subtracting a B-phase offset correction value from a B-phase digital signal to thereby obtain an offset-corrected value, and an angle detecting circuit 23 for detecting an angle based on the offset-corrected A-phase and B-phase signals.

The above described conventional offset correction circuit has a problem in that when the sampling period is long relative to the input frequency, it takes time to obtain a value which is to be sampled at the time of zero-crossing, and therefore, it takes time to obtain an offset correction value. This hinders obtaining a correct offset correction value.

FIGS. 11a to 11c, 12a to 12c and 13a to 13e are diagrams for explaining the relation between zero-crossing and sampling in the conventional offset correcting circuit. FIGS. 11a to 11c relate to the case where a value can be sampled at the time of zero-crossing, and FIGS. 12a to 12c relate to the case where a value can not be sampled at the time of zero-crossing. In the case of FIGS. 11a to 11c where zero-crossing occurs corresponding to a sampling point of time, among the values (points in FIG. 11a) of the A-phase signal sampled in accordance with a clock signal (FIG. 11c), a sampled signal value V2 corresponding to zero-crossing of the B-phase analog signal (FIG. 11b) can be used as one of the values required for computing an offset value.

In contrast thereto, in the case of FIGS. 12a to 12c where zero-crossing occurs not corresponding to a sampling point of time, there is no signal value sampled corresponding to zero-crossing of the B-phase analog signal (FIG. 12b) among the values (points in FIG. 12a) of the A-phase signal sampled in accordance with a clock signal (FIG. 12c). Therefore, a value required for computing an offset value cannot be obtained at this time.

Therefore, in the case shown in FIGS. 13a to 13e, because of the necessity of correspondence between a sampling point and the B-phase analog signal's zero-crossing (FIG. 13b), it takes time longer than the interval of zero-crossing to obtain values V2 and V4 which can be used for computing an offset value among the sampled values of the A-phase signal (FIG.

13a), as shown in FIGS. 13c and 13d. Therefore, it takes a long time to obtain an offset correction signal (V2+V4)/2, and therefore, a correct offset value cannot be obtained.

Further, detection of voltages of the A-phase and B-phase signals for obtaining an offset value is normally performed only once, and the detected voltage changes to a large degree in the presence of noise. Therefore, there is also a problem that the influence of noise on the offset value is serious.

SUMMARY OF THE INVENTION

An object of the present invention is to provide an offset correcting circuit which can detect a correct offset value even when a sampling period is long as in the case of a low-speed A/D converter or the like. Another object of the present invention is to provide an offset correcting circuit where influence of noise is restrained.

An offset correcting circuit according to the present invention detects a voltage of each signal required for obtaining an offset value in a manner not influenced by the length of a sampling period. Therefore, it is possible to detect a correct offset value even when the sampling period is long as in the case of a low-speed A/D converter or the like. Further, the offset correcting circuit according to the present invention obtains an offset value of each signal using a plurality of voltage values of each signal. Therefore, it is possible to restrain the influence of noise on detection of an offset value.

The present invention provides an offset correcting circuit for an encoder adapted to output an angle signal based on digital signals which are obtained by performing A/D conversions of two signals having phases different by about 90 degrees (A-phase signal and B-phase signal) in accordance with the same timing. The offset correcting circuit has an offset detecting circuit for obtaining an offset value of one of the two signals, using an A/D converted value of that one signal which is obtained when an A/D converted value of the other of the two signals is zero or close to zero, and a compensating circuit for compensating an offset of that one signal using the offset value.

The offset detecting circuit includes an A-phase offset detecting circuit for obtaining an offset value of the A-phase signal using an A/D converted value of the A-phase signal which is obtained when an A/D converted value of the B-phase signal is zero or close to zero, and a B-phase offset detecting circuit for obtaining an offset value of the B-phase signal using an A/D converted value of the B-phase signal which is obtained when an A/D converted value of the A-phase signal is zero or close to zero. The A-phase offset detecting circuit judges whether an A/D converted value of the B-phase signal is zero or close to zero or not, detects an A/D converted value of the A-phase signal when the A/D converted value of the B-phase signal which is zero or close to zero is detected in accordance with clocking, and uses the detected A/D converted value of the A-phase signal for obtaining an offset value of the A-phase signal. The B-phase offset detecting circuit judges whether an A/D converted value of the A-phase signal is zero or close to zero or not, detects an A/D converted value of the B-phase signal when the A/D converted value of the A-phase signal which is zero or close to zero is detected in accordance with clocking, and uses the detected A/D converted value of the B-phase signal for obtaining an offset value of the B-phase signal.

The compensating circuit includes an A-phase compensating circuit for compensating an offset of the A-phase signal using the offset value of the A-phase signal detected by the A-phase offset detecting circuit, and a B-phase compensating circuit for compensating an offset of the B-phase signal using the offset value of the B-phase signal detected by the B-phase offset detecting circuit.

The offset detecting circuit detects a value of one of the two signals required for computing an offset value of that signal each time the other signal's crossing a region close to zero is detected in accordance with timing for A/D conversion. Thus, detection is performed corresponding to zero-crossing of each signal, and not influenced by the length of a sampling period. This makes it possible to detect a correct offset value even when the sampling period is long.

The offset detecting circuit obtains an offset value of one of the two signals as an average of positive and negative A/D converted values of that signal which are obtained when an A/D converted value of the other signal is within a range determined by a threshold close to zero.

Each of the A-phase and B-phase offset detecting circuits observes whether an A/D converted value of one of the signals lies within a range of, for example, 0±Vd, that is, a range which is close to zero and determined by a threshold Vd, and if it lies within that range, considers that the signal has approximately crossed zero, and obtains an A/D converted value of the other signal at that time of sampling for A/D conversion. Thus, it is possible to obtain an A/D converted value which one of the two signals takes around the time when the other signal crosses zero.

The A/D converted value of each signal obtained as described above is positive or negative. The offset detecting circuit computes an average of positive and negative A/D converted values of each signal, to be used as an offset value of each signal.

In order to restrain the influence of noise on detection of an offset value, the offset detecting circuit computes an average of positive and negative A/D converted values using a plurality of positive A/D converted values and a plurality of negative A/D converted values to thereby reduce the influence of noise included in a detected A/D converted value on an offset value.

Further, the offset detecting circuit is arranged to renew positive and negative A/D converted values for obtaining an average, alternately, in order to prevent unbalanced detection of positive and negative A/D converted values from the viewpoint of time. This can also prevent detection of only positive or negative values of one signal which may occur if an object of detection is standing or vibrating minutely around the time when the other signal crosses zero.

If an A/D converted value of one signal is not obtained around the time the other signal crosses zero, it may cause unbalance between positive and negative A/D converted values from the viewpoint of the time when each value is obtained. Therefore, positive and negative A/D converted values to be used for computing an average is renewed alternately to thereby prevent unbalance between positive and negative A/D converted values from the viewpoint of time.

The offset detecting circuit has, for each of the two signals, a latch circuit series for positive A/D converted values and a latch circuit series for negative A/D converted values, each of said latch circuit series being composed of serially connected latch circuits including an end latch circuit serving as an input terminal for A/D converted values, and a computing circuit for adding an output of the latch circuit series for positive A/D converted values and an output of the latch circuit series for negative A/D converted values and dividing the added outputs by the total number of the latch circuits included in the two latch circuit series whose outputs are added to thereby obtain an average of a plurality of positive A/D converted values and a plurality of negative A/D converted values.

The compensating circuit can be formed as a subtracting circuit for subtracting an offset value of one of the two signals obtained by the offset detecting circuit from an A/D converted value of that signal.

BRIEF DESCRIPTION OF DRAWINGS

FIGS. 4a to 4c are enlarged schematic diagrams for showing relation between sampled A/D converted values and zero-crossing in the offset detecting circuit of the present invention;

FIGS. 5a to 5i are diagrams for showing relation between signals having different phases and their offset values in the offset correcting circuit according to the present invention;

FIGS. 7a to 7i are signal diagrams for showing operation of the offset detecting circuit of the present invention;

FIGS. 8a to 8j are diagrams for showing an offset produced at an encoder;

FIGS. 9a and 9b are signal diagrams for showing a conventional offset correcting method;

FIG. 10 is a schematic block diagram showing a conventional offset correcting circuit;

FIGS. 11a to 11c are diagrams for showing relation between zero-crossing and sampling in a conventional offset correcting circuit;

FIGS. 12a to 12c are diagrams for showing relation between zero-crossing and sampling in a conventional offset correcting circuit.

DESCRIPTION OF THE PREFERRED EMBODIMENTS

An example of structure of an embodiment of the present invention will be described using FIG. 1 which is a schematic block diagram for explaining an offset correcting circuit for an encoder according to the present invention.

Figure 1:
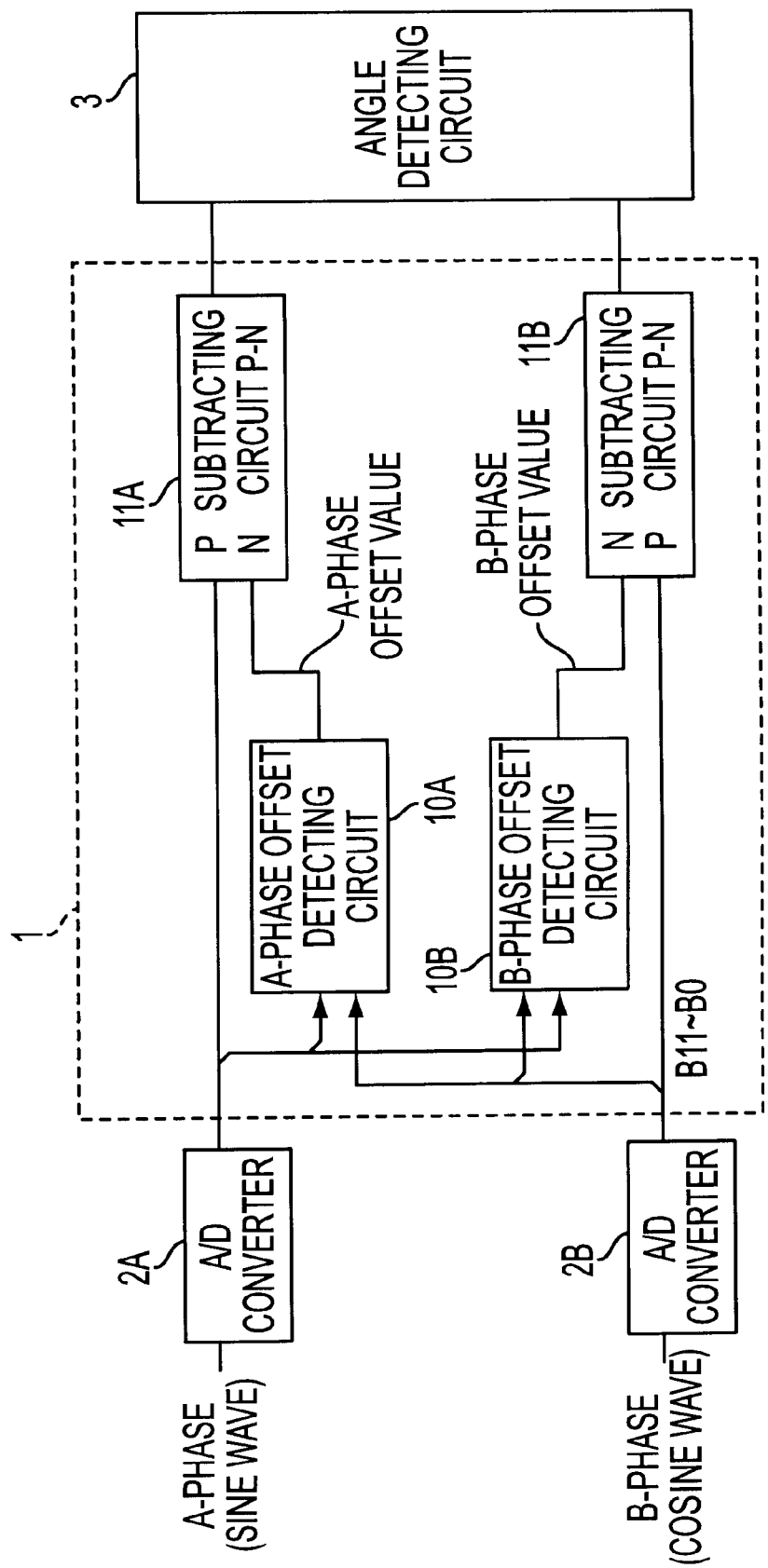
FIG. 1 is a schematic block diagram showing an offset correcting circuit for an encoder according to the present invention.

In FIG. 1, an offset correcting circuit 1 denoted by a broken line has an A-phase offset detecting circuit 10A, a B-phase offset detecting circuit 10B and subtracting circuits 11A and 11B.

The A-phase offset detecting circuit 10A obtains an offset value of an A-phase signal using an A/D converted value which the A-phase signal takes when an A/D converted value of a B-phase signal is close to zero. A digital value obtained by A/D conversion of the A-phase signal by an A/D converter 2A and a digital value obtained by A/D conversion of the B-phase signal by an A/D converter 2B are fed to the A-phase offset detecting circuit 10A. The A-phase offset detecting circuit 10A judges whether the input A/D converted value of the B-phase signal is close to zero or not. If it is close to zero, the A-phase offset detecting circuit 10A detects an A/D converted value of the A-phase signal at that time of clocking for A/D conversion, and then obtains an offset value of the A-phase signal using the detected value.

The B-phase offset detecting circuit 10B obtains an offset value of the B-phase signal using an A/D converted value which the B-phase signal takes when an A/D converted value of the A-phase signal is close to zero. A digital value obtained by A/D conversion of the B-phase signal by the A/D converter 2B and a digital value obtained by A/D conversion of the A-phase signal by the A/D converter 2A are fed to the B-phase offset detecting circuit 10B. The B-phase offset detecting circuit 10B detects an A/D converted value which the A-phase signal takes when the A-phase signal is close to zero, and obtains an offset value of the B-phase signal using the detected value.

The subtracting circuits 11A and 11B are compensating circuits which compensate offsets included in A/D converted values of the A-phase and B-phase signals, using the offset values detected by the offset detecting circuits 10A and 10B. The subtracting circuit 11A takes in an A/D converted value of the A-phase signal from a P-terminal and an offset value of the A-phase signal from an N terminal, and executes subtraction (P–N). The subtracting circuit 11B takes in an A/D converted value of the B-phase signal from a P-terminal and an offset value of the B-phase signal from an N terminal, and executes subtraction (P–N). The subtracting circuits 11A and 11B output offset-compensated A-phase and B-phase signals, and an angle detecting circuit 3 detects an angle.

Figure 2:
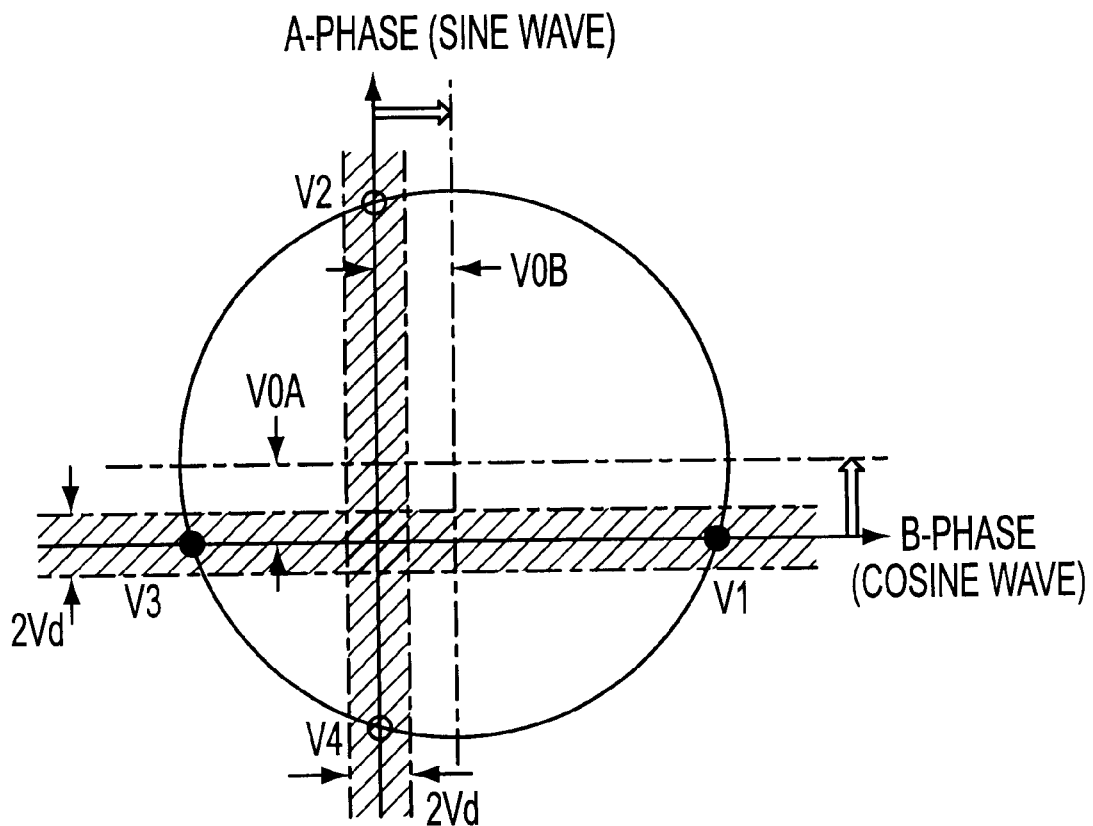
FIG. 2 shows detection of an offset value by an offset detecting circuit of the present invention.

Next, detection of an offset value by the offset detecting circuit of the present invention will be explained. In FIG. 2, a coordinate system represented by dashed lines is that in the case where no offset is produced, and a coordinate system represented by solid lines is that in the case where an offset V0A is produced in respect of the A-phase signal and an offset V0B is produced in respect of the B-phase signal. Therefore, when the A-phase signal (sine wave) shows zero in the latter coordinate system, the A-phase signal actually deviates from zero by a value corresponding to the offset V0A, and when the B-phase signal (cosine wave) shows zero in the latter coordinate system, the B-phase signal actually deviates from zero by a value corresponding to the offset V0B.

In the case where no offset is produced, in the coordinate system represented by dashed lines, positive and negative values which the A-phase signal takes when the B-phase signal crosses zero are of the same absolute value, and positive and negative values which the B-phase signal takes when the A-phase signal crosses zero are of the same absolute value. In contrast thereto, in the case where offsets are produced, in the coordinate system represented by solid lines, a positive value V2 and a negative value V4 (denoted by white circles in FIG. 1) which the A-phase signal takes when the B-phase signal crosses zero are of different absolute values, and a positive value V1 and a negative value V3 (denoted by black circles in FIG. 1) which the B-phase signal takes when the A-phase signal crosses zero are of different absolute values. The positive value (V2 or V1) and negative value (V4 or V3) of each of the A-phase and B-phase signals are related to the offset value (V0A or V0B) of each of the signals. The relation can be represented by the following equations (1) and (2):

$$V0A = (V2 + V4)/2 \quad (1)$$

$$V0B = (V1 + V3)/2 \quad (2)$$

Figure 3A:
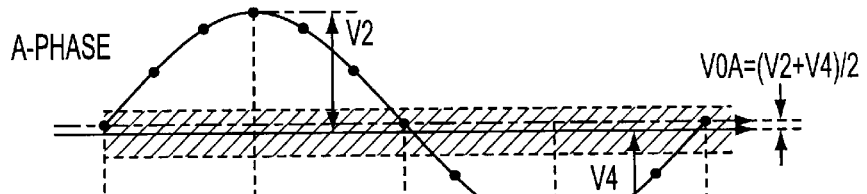
FIGS. 3a to 3c are signal diagrams for showing relation between sampled A/D converted values and zero-crossing in the offset detecting circuit of the present invention.
Figure 3B:
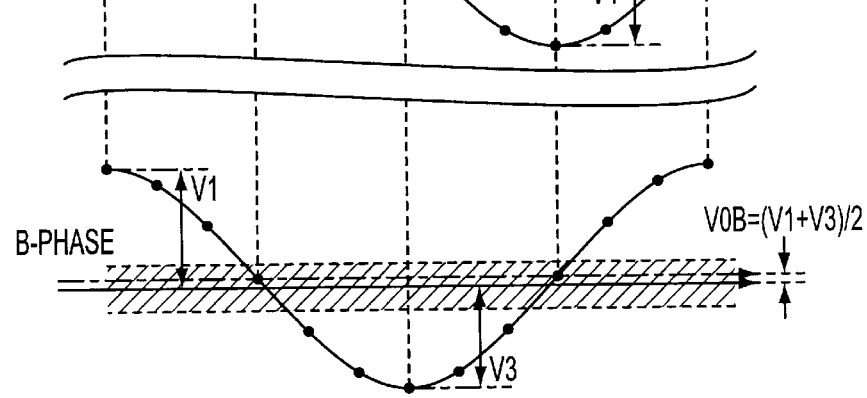
Figure 3C:

FIGS. 3a to 3c are signal diagrams showing the above relation. In FIGS. 3a and 3b, the zero level in the case where no offset is produced is represented by a dashed line and the zero level in the case where an offset is produced is represented by a solid line, as in FIG. 2. A positive value V2 and a negative value V4 of the A-phase signal are values which the A-phase signal takes when the B-phase signal crosses zero, and a positive value V1 and a negative value V3 of the B-phase signal are values which the B-phase signal takes when the A-phase signal crosses zero.

FIGS. 2 and 3a to 3c relate to the case where zero-crossing occurs corresponding to clocking for sampling for A/D conversion. In this case, an A/D converted value of one of the signals exists every time the other signal crosses zero.

In actual sampling for A/D conversion, zero-crossing does not always occur corresponding to clocking for sampling for A/D conversion. Sometimes there exists no sampled A/D converted value of one of the signals when the other signal crosses zero. In the offset detecting circuit of the present invention, a certain range is allowed to a threshold for detecting zero-crossing. Zero-crossing of one signal is detected by judging whether an A/D converted value of that signal lies within a predetermined range or not, and an A/D converted value of the other signal which is sampled at the time when approximate zero-crossing of the former signal is thus detected is used as a value for detecting an offset.

In FIGS. 2, 3a and 3b, each region shown by oblique lines is a region where a signal is regarded as close to zero-crossing and therefore detection of a value of the other signal, which is used for detecting an offset, is allowed. Such detection region is, for example, determined to have a width of voltage Vd in each of the positive and negative directions, therefore, a width of voltage 2 Vd in total.

Thus, even when zero-crossing does not occur corresponding to clocking for sampling for A/D conversion, if a sampled A/D converted value of one signal lies within a range of voltage Vd from zero on the positive side or the negative side, that signal is regarded as crossing zero, and an A/D converted value which the other signal takes at that time is allowed to be detected as a value used for detecting an offset. When the relation between the sampling frequency and the frequency of each signal is that in general practice, it is possible to arrange that a sampled A/D converted value of one signal can be obtained each time the other signal is regarded as crossing zero, by regulating the voltage Vd.

FIGS. 4a to 4c are enlarged schematic diagrams for showing the relation between sampled A/D converted values and zero-crossing. In FIG. 4b, within the voltage range (2 Vd) shown by oblique lines exists an A/D converted value (black circle in FIG. 4b) of the B-phase signal sampled in accordance with clocking for sampling (FIG. 4c). The A-phase offset detecting circuit judges whether an A/D converted value of the B-phase signal lies within that voltage range (2 Vd) or not, and if it lies within that voltage range (2 Vd), considers that the B-phase signal has approximately crossed zero and reads an A/D converted value V2 which the A-phase signal takes at that time, to be used as data for detecting an offset value.

FIGS. 4a to 4c show how an A/D converted value V2 (positive value) of the A-phase signal is detected when the B-phase signal crosses zero in the process of changing from a positive value to a negative value. When the B-phase signal crosses zero in the process of changing from a negative value to a positive value, an A/D converted value V4 (negative value) of the A-phase signal can be detected in the same manner. Using the A/D converted value V2 (positive value) and the A/D converted value V4 (negative value), the offset value of the A-phase signal can be detected.

The offset value of the B-phase signal can be detected in the same way as the offset value of the A-phase signal.

Figure 5A:
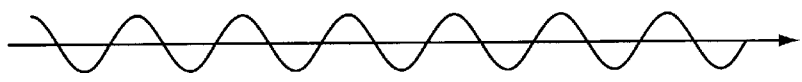
Figure 5B:
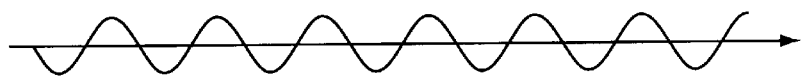
Figure 5C:
Figure 5D:
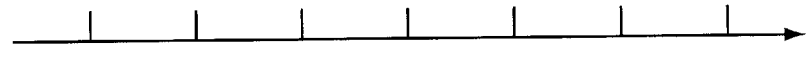
Figure 5E:
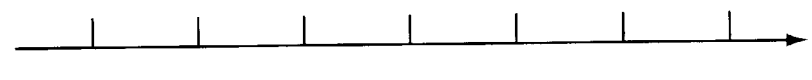
Figure 5F:
Figure 5G:
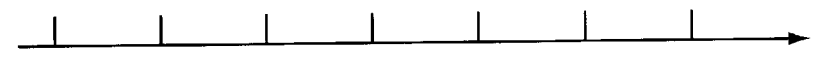
Figure 5H:

FIGS. 5a to 5i are diagrams for showing the relation between the A-phase and B-phase signals and their offset values in the offset correcting circuit according to the present invention. FIGS. 5a and 5b show the A-phase signal and the B-phase signal, respectively. As shown in FIGS. 2, 3a to 3c, and 4a to 4c, positive and negative A/D converted values V2, V4 (FIGS. 5c and 5d) of the A-phase signal are detected around the time when the B-phase signal crosses zero, and an offset value V0A (FIG. 5e) is computed using those A/D converted values V2, V4 in accordance with the above mentioned equation (1). In the case of FIG. 5e, the offset value V0A is computed each time the A/D converted value V4 is detected, using that A/D converted value V4 and the A/D converted value V2 detected at the time of the preceding zero-crossing. It is also possible to compute the offset value V0A each time the A/D converted value V2 is detected, using that A/D converted value V2 and the A/D converted value V4 detected at the time of the preceding zero-crossing. Further, it is also possible to compute the offset value each time one of the two A/D converted values is detected, using that A/D converted value and the other A/D converted value detected at the time of the preceding zero-crossing. In this case, the interval of offset detection can be shortened to half of the interval in the other cases.

For the B-phase signal, same as for the A-phase signal, positive and negative A/D converted values V1, V3 (FIGS. 5f and 5g) of the B-phase signal are detected around the time when the A-phase signal crosses zero, and an offset value V0B (FIG. 5h) is computed using those A/D converted values V1, V3 in accordance with the above mentioned equation (2). Same as in the case of the A-phase signal, the offset value V0B of the B-phase signal can be obtained by various combinations of positive and negative A/D converted values.

Next, more detailed structure and operation of the offset detecting circuit will be described with reference to FIGS. 6 and 7a to 7i.

Figure 6:
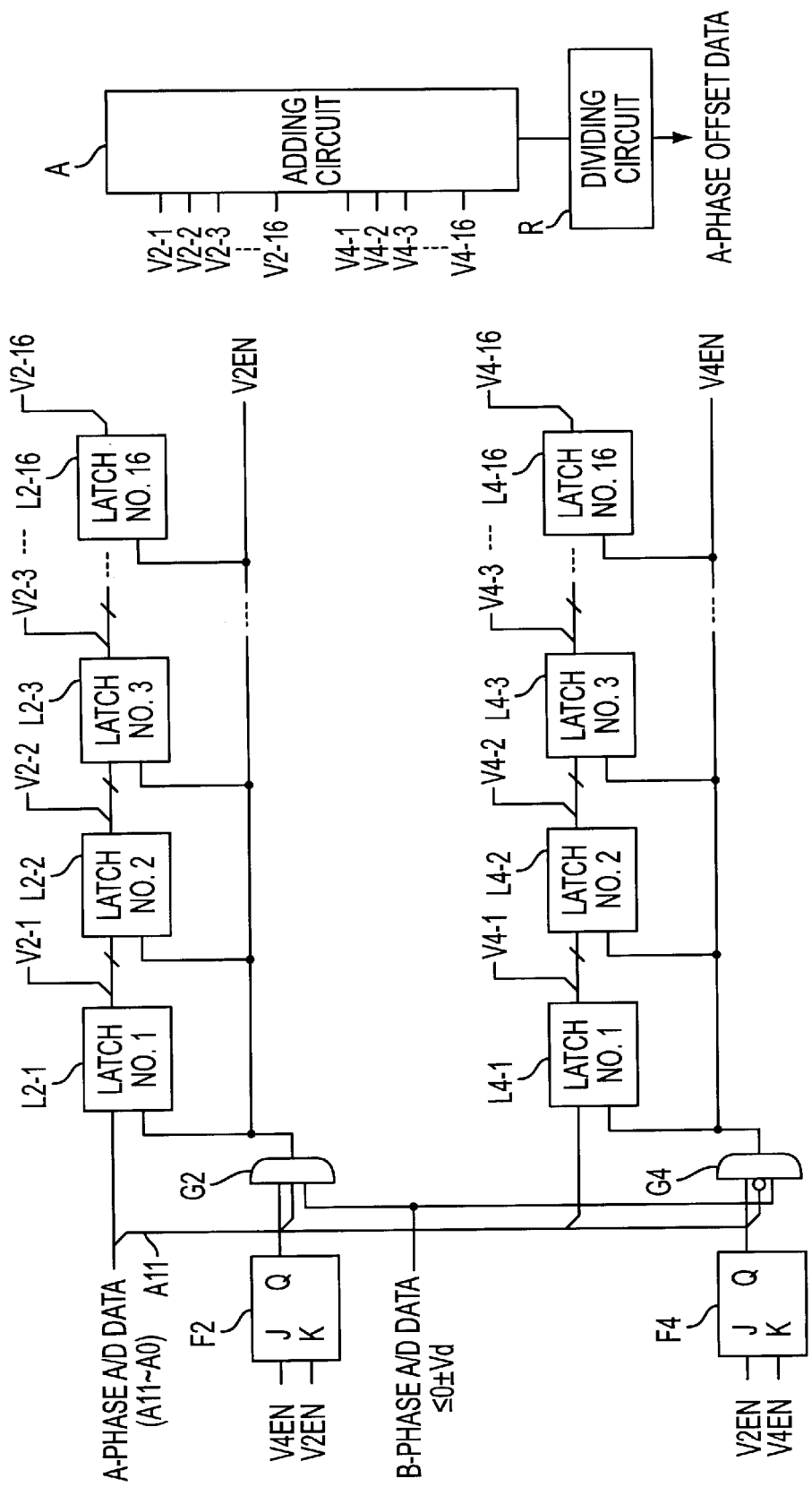
FIG. 6 is a block circuit diagram showing detailed structure of an offset detecting circuit of the present invention.

The offset detecting circuit shown in FIG. 6 is arranged to obtain an average of a plurality of positive A/D converted values and a plurality of negative A/D converted values. FIG. 6 shows circuit formation for obtaining an offset value of the A-phase signal. Circuit formation for obtaining an offset value of the B-phase signal is omitted since it is similar to that for the A-phase signal.

In FIG. 6, a circuit for reading and storing a plurality of positive A/D converted values is comprised of a plurality of latch circuits Nos. 1 to 16 connected in series and denoted by reference signs L2-1 to L2-16, a J-K flip-flop F2 and an AND gate G2, and a circuit for reading and storing a plurality of negative A/D converted values is comprised of a plurality of latch circuits Nos. 1 to 16 connected in series and denoted by reference signs L4-1 to L4-16, a J-K flip-flop F4 and an AND gate G4. A circuit for obtaining an average of A/D converted values is comprised of an adding circuit A for adding the outputs V2-1 to V2-16 of the latch circuits L2-1 to L2-16 and the outputs V4-1 to V4-16 of the latch circuits L4-1 to L4-16, and a dividing circuit R for dividing the output of the adding circuit A by the number of all the latch circuits.

Since the formation of the circuit for reading and storing a plurality of positive A/D converted values is the same as the formation of the circuit for reading and storing a plurality of negative A/D converted values, only the formation of the circuit for reading and storing a plurality of positive A/D converted values will be explained below.

An A/D converted value of the A-phase signal is fed to the first latch circuit L2-1 of the serially connected latch circuits L2-1 to L2-16. Each of the latch circuits L2-1 to L2-16 transmits data to the next latch circuit and transmits each output V2-1 to V2-16 to the adding circuit A in accordance with timing by the AND gate G2. The data transmission and data output by the latch circuits are timed by the output of the AND gate G2. The AND gate G2 is arranged to output an enabling signal when the conditions for detecting an offset value are satisfied. When a positive A/D converted value V2 is to be detected, the AND gate outputs an enabling signal V2EN when the conditions that a negative A/D converted value V4 is retained, that an A/D converted value of the A-phase signal is positive, and that an A/D converted value of the B-phase signal lies within the range of 0±Vd are all satisfied.

For the above operation, a value of MSB (Most Significant Bit) of an A/D converted value of the A-phase signal, a Q output of the J-K flip-flop F2, and a signal indicating that an A/D converted value of the B-phase signal lies within the range of 0±Vd are fed to the AND gate G2.

An enabling signal V4EN for the circuit for reading and storing a plurality of negative A/D converted values is fed to the J terminal of the J-K flip-flop F2, and an enabling signal V2EN for the circuit for reading and storing a plurality of positive A/D converted values is fed to the K terminal of the J-K flip-flop F2. The Q output of the J-K flip-flop F2 is high when a negative A/D converted value V4 is retained.

With the above formation, the offset detecting circuit can renew positive and negative A/D converted values for obtaining an average, alternately, to thereby prevent unbalanced detection of positive and negative A/D converted values from the viewpoint of time.

The circuit for reading and storing a plurality of negative A/D converted values can be formed in the same manner.

The circuit for obtaining an average of A/D converted values can be comprised of an adding circuit A and a dividing circuit R. The adding circuit A adds the outputs V2-1 to V2-16 of the latch circuits L2-1 to L2-16 and the outputs V4-1 to V4-16 of the latch circuits L4-1 to L4-16. The dividing circuit R divides the output of the adding circuit A by the number of all the latch circuits to thereby obtain an offset value of the A-phase signal.

If 32 pieces of data are added by the adding circuit A as in the above described case, the dividing circuit R can be provided as a five bit shift circuit.

Figure 7A:
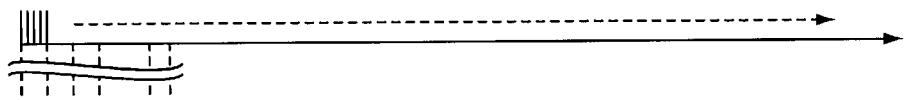
Figure 13A:
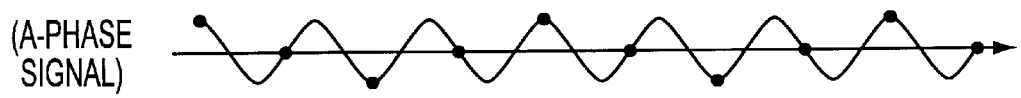
FIGS. 13a to 13e are diagrams for showing relation between zero-crossing and sampling in a conventional offset correcting circuit.
Figure 13B:
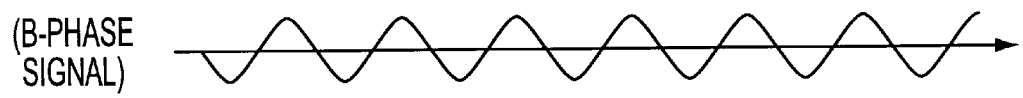
Figure 13C:
Figure 13D:
Figure 13E:

FIGS. 7a to 7i are signal diagrams for showing an example of operation of the offset detecting circuit of the formation shown in FIG. 6. The A-phase signal and the B-phase signal are sampled in accordance with a clock signal shown in FIG. 7a, and converted to A/D converted values (FIGS. 7b, 7c). In FIGS. 7b and 7c, A/D converted values are shown with some intervening ones omitted.

A positive A/D converted value V2 and a negative A/D converted value V4 of the A-phase signal are read when an A/D converted value of the B-phase signal is close to zero (FIG. 7c). Each time a positive or negative A/D converted value V2 or V4 is detected, the enabling signal V2EN or V4EN for the A-phase signal is outputted. In FIGS. 7d and 7e, an interval between outputs of the enabling signal V2EN or V4EN for the A-phase signal means that an A/D converted value of the A-phase signal has not been obtained around the time when the B-phase signal crossed zero in that interval.

An offset value of the A-phase signal is obtained by average computing means including an adding circuit and a dividing circuit. Change of the offset value of the A-phase signal in FIG. 7f shows that A/D converted values are added one by one at the adding circuit, so that an obtained average value comes close to a correct offset value, gradually.

FIGS. 7g, 7h, 7i show enabling signals V1EN and V3EN for the B-phase signal and change of an offset value of the B-phase signal, respectively. Explanation of each of these signals will be omitted since the same explanation as that of FIGS. 7d, 7e, 7f relating to the A-phase signal can be applied to these signals.

In the present embodiment, since an offset value is obtained using 16 A/D converted values, influence of noise which is possibly involved in an A/D converted value can be diminished. Further, quick response to the change of an offset is effected since 16 A/D converted values are renewed one by one in order of oldness. Furthermore, it is advantageous from the viewpoint of cost that the offset correcting circuit can be formed as a gate array.

As described above, with the offset correcting circuit for an encoder according to the present invention, a correct offset value can be detected even when the sampling period is long as in the case of a low-speed A/D converter or the like. Further, it can be so arranged that the influence of noise is restrained.

What is claimed is:

1. An offset correcting circuit for an encoder which outputs an angle signal based on digital signals obtained by performing A/D conversions of two signals having phases different by substantially 90 degrees at the same timing, comprising:

an offset detecting circuit to obtain an offset value of one of said two signals using A/D converted values of said one signal, which are obtained when an A/D converted value of the other of said two signals is within a predetermined range surrounding a reference value; and a compensating circuit to compensate an offset of said one signal using said offset value.

2. An offset correcting circuit for an encoder according to claim 1, wherein said offset detecting circuit obtains said offset value of said one signal as an average of a positive A/D converted value and a negative A/D converted value of said one signal, which are obtained when an A/D converted value of said other signal is within the predetermined range surrounding the reference value.

3. An offset correcting circuit for an encoder according to claim 2, wherein said offset value is an average value of a plurality of positive A/D converted values and a plurality of negative A/D converted values.

4. An offset correct circuit for an encoder according to claim 3, wherein said offset detecting circuit comprises:

a plurality of latch circuits connected in series, including an end latch circuit serving as an input terminal for the positive A/D converted values;

a plurality of latch circuits connected in series with an end latch circuit serving as an input terminal for the negative A/D converted values for each of said two signals; and a computing circuit to add an output of said series latch circuits for the positive A/D converted values and an output of said series latch circuit for the negative A/D converted values and to divide the added values by the total number of the latch circuits to obtain the average value.

5. An offset correcting circuit for an encoder according to claim 3, wherein said positive and negative A/D converted values for obtaining the average value are updated alternately.

6. An offset correcting circuit for an encoder according to claim 5, wherein said offset detecting circuit comprises:
- a plurality of latch circuits connected in series with an end latch circuit serving as an input terminal for the positive A/D converted values;
- a plurality of latch circuits connected in series with an end latch circuit serving as an input terminal for the negative A/D converted values for each of said two signals; and
- a computing circuit to add an output of said series latch circuits for the positive A/D converted values and an output of said series latch circuit for the negative A/D converted values and to divide the added values by the total number of the latch circuits to obtain the average value.

7. An offset correcting circuit for an encoder according to claim 1, wherein said compensating circuit comprises a subtracting circuit to subtract said offset value of said one signal obtained by said offset detecting circuit from an A/D converted value of said one signal.

8. An offset correcting circuit for an encoder which outputs an angle signal based on digital signals obtained by performing A/D conversions of two signals having phases different by substantially 90 degrees at the same timing, comprising:
- an offset detecting circuit to obtain an offset value of one of said two signals using A/D converted values of said one signal, which are obtained when an A/D converted value of the other of said two signals is zero or in the vicinity of zero; and
- a compensating circuit to compensate an offset of said one signal using said offset values,
- wherein said compensating circuit comprises a subtracting circuit to subtract said offset value of said one signal obtained by said offset detecting circuit from an A/D converted value of said one signal.

* * * * *

UNITED STATES PATENT AND TRADEMARK OFFICE
CERTIFICATE OF CORRECTION

PATENT NO. : 6,215,426 B1
DATED : April 10, 2001
INVENTOR(S) : Mitsuyuki Taniguchi et al.

It is certified that error appears in the above-identified patent and that said Letters Patent is hereby corrected as shown below:

<u>Column 10,</u>
Line 57, change "correct" to -- correcting --.

Signed and Sealed this

Twenty-ninth Day of January, 2002

Attest:

*Attesting Officer*

JAMES E. ROGAN
*Director of the United States Patent and Trademark Office*